United States Patent [19]
Copeland et al.

[11] Patent Number: 4,752,283
[45] Date of Patent: Jun. 21, 1988

[54] WASTE WATER CLEANING SYSTEM FOR USE WITH APPARATUS FOR PROCESSING EXPOSED LITHOGRAPHIC PLATES

[75] Inventors: Harry J. Copeland, Springfield; Edward H. Parker, Ballwin, both of Mo.

[73] Assignee: Western Litho Plate & Supply Co., St. Louis, Mo.

[21] Appl. No.: 15,663

[22] Filed: Feb. 17, 1987

[51] Int. Cl.$^4$ .................. B04B 11/04; B04B 13/00
[52] U.S. Cl. ................................. 494/37; 210/138; 134/10; 134/109; 354/324
[58] Field of Search ............... 210/739, 781, 138, 143, 210/767, 141; 494/5, 7, 11, 37; 354/317, 325, 324; 134/10, 13, 18, 109, 110, 111

[56] References Cited

U.S. PATENT DOCUMENTS

| | | | |
|---|---|---|---|
| 2,080,874 | 5/1937 | Pecker | 210/138 |
| 2,271,493 | 1/1942 | Brewer | 210/138 |
| 2,822,092 | 2/1958 | Masson | 210/138 |
| 3,038,611 | 6/1962 | O'Conor et al. | 210/138 |
| 3,430,851 | 3/1969 | Abt | 494/11 |
| 4,222,656 | 9/1980 | Harrell et al. | 354/317 |

*Primary Examiner*—Richard V. Fisher
*Assistant Examiner*—Linda S. Evans
*Attorney, Agent, or Firm*—Senniger, Powers, Leavitt and Roedel

[57] ABSTRACT

A waste water cleaning system for use with apparatus for processing exposed lithographic plates, the processing apparatus receiving wash water for use in the processing. The cleaning system includes a centrifuge for removing contaminants from waste water from the processing apparatus, the centrifuge having an inlet for receiving waste water from the processing apparatus and an outlet for discharging the cleaned water. The cleaning system also includes means for carrying the waste water from the processing apparatus to the inlet. The cleaning system further includes control means for controlling the operation of the processing apparatus and the centrifuge. The control means includes means for starting the centrifuge and means for starting the flow of wash water into the processing apparatus a first predetermined time after the start of the centrifuge. The control system also includes means for stopping the flow of wash water into processing apparatus and means for stopping the centrifuge a second predetermined time after stopping the flow of wash water into the processing apparatus. Other forms of the invention including methods thereof are also disclosed.

15 Claims, 4 Drawing Sheets

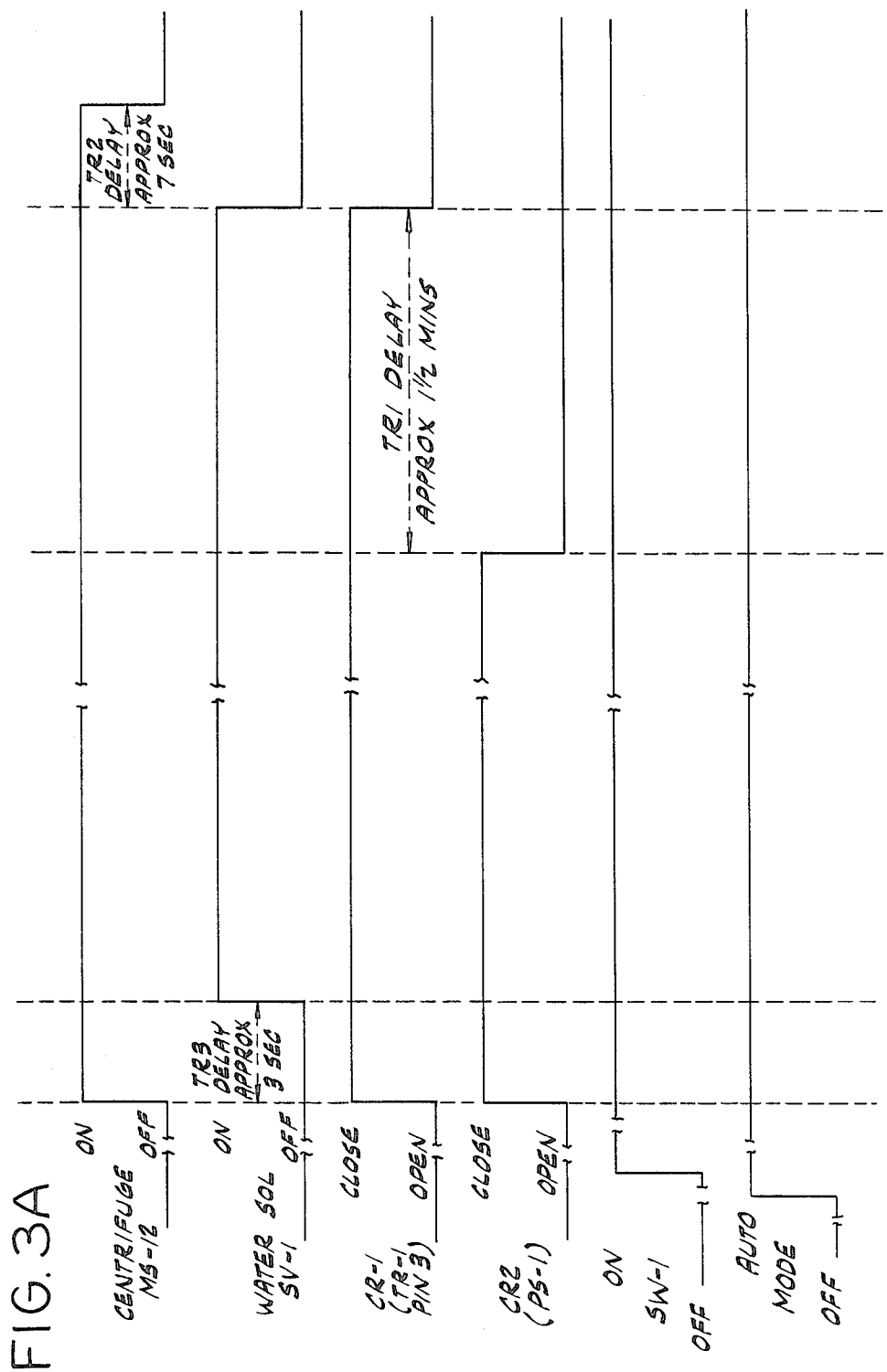

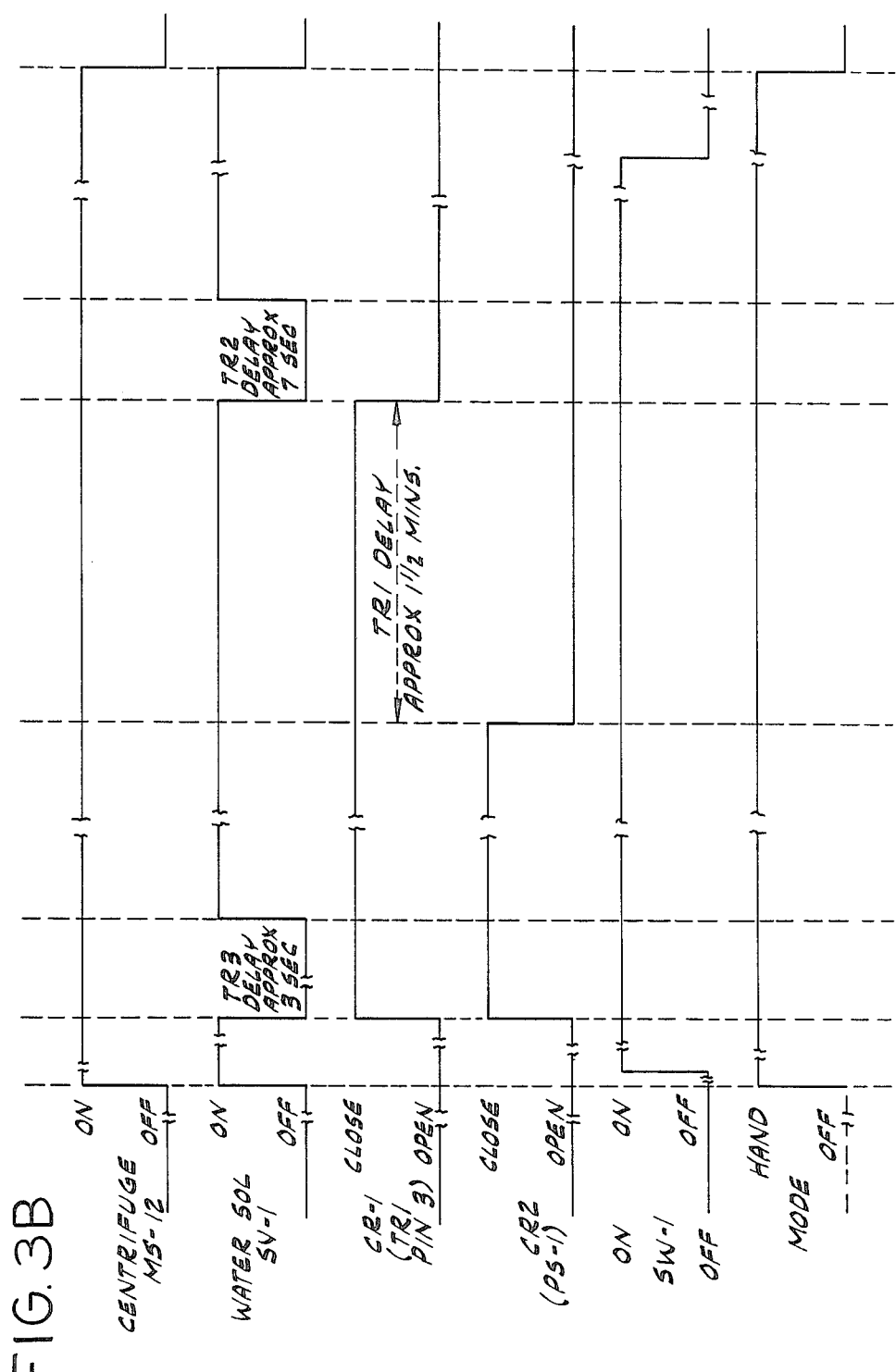

4,752,283

WASTE WATER CLEANING SYSTEM FOR USE WITH APPARATUS FOR PROCESSING EXPOSED LITHOGRAPHIC PLATES

BACKGROUND OF THE INVENTION

This invention relates to a waste water cleaning system for use with apparatus for processing exposed lithographic plates, the processing apparatus receiving wash water for removing chemicals used in the processing. A centrifuge is connected to receive waste water from the processing apparatus and removes contaminants in the waste water.

With the enactment of the Clean Water Act, disposal of waste water through sewer systems has taken on added importance and complexity. The Clean Water Act regulates the effluent coming from all sources whether they be publicly or privately owned treatment plants, industry, home, etc. Placing an effluent in a publicly or privately owned sewer passes the responsibility of adhering to the Clean Water Act on to the treating facility. In order to meet the limitations set forth by the Clean Water Act, treatment facilities, in turn, have issued their own ordinances regulating what can and can not be placed in the sewer. These ordinances generally regulate the type and amount of solid material contained in the waste water for sewer disposal.

Apparatus designed for the processing of exposed lithographic plates typically includes a source of water for rinsing or washing residues including unexposed sensitizer, polymer, photopolymer, spent developer, and spent finisher from the lithographic plate and transport rollers. These residues include solid contaminants such as resins, pigments, fillers, clays, talcs, and other water insoluble organic and inorganic compounds which may not be placed in sewers due to environmental regulations. Moreover, because these solid contaminants are heavy and/or sticky, the drain lines may become clogged and require frequent cleaning.

Filtering systems have proved unsatisfactory for removing the contaminants from the waste water. The small micron size filters required for separation will clog rapidly because of the volume of solid waste and the filters will become quickly blinded or clogged due to resinous matter contained in the waste water. Downtime during which the filters are being replaced or cleaned will result in lost production.

SUMMARY OF THE INVENTION

Among the several objects of the present invention may be noted the provision of a waste water cleaning system for use with apparatus for processing exposed lithographic plates; the provision of such a system which advantageously removes contaminants from waste water; the provision of such system which reduces downtime for cleaning; and the provision of such system which does not require the cleaning or replacement of filters.

Briefly, a waste water cleaning system of this invention is for use with apparatus for processing exposed lithographic plates, the processing apparatus receiving wash water for use in the processing. The cleaning system includes a centrifuge for removing contaminants from waste water from the processing apparatus and has an inlet for receiving waste water from the processing apparatus and an outlet for discharging the cleaned water. The cleaning system also includes means for carrying the waste water from the processing apparatus to the inlet. The cleaning system further has control means for controlling the operation of the processing apparatus and the centrifuge. The control means includes means for starting the centrifuge and means for starting the flow of wash water into the processing apparatus a first predetermined time after the start of the centrifuge. The control system also includes means for stopping the flow of wash water into processing apparatus and means for stopping the centrifuge a second predetermined time after stopping the flow of wash water into the processing apparatus.

Other objects and features will be in part apparent and in part pointed out hereinafter.

BRIEF DESCRIPTION OF THE DRAWINGS

FIGS. 3A and 3B are timing diagrams for the schematic of FIG. 2 with a mode switch in the Auto or Hand position respectively.

Corresponding reference characters indicate corresponding parts throughout the several views of the drawings. ings.

DETAILED DESCRIPTION OF A PREFERRED EMBODIMENT

Figure 1:
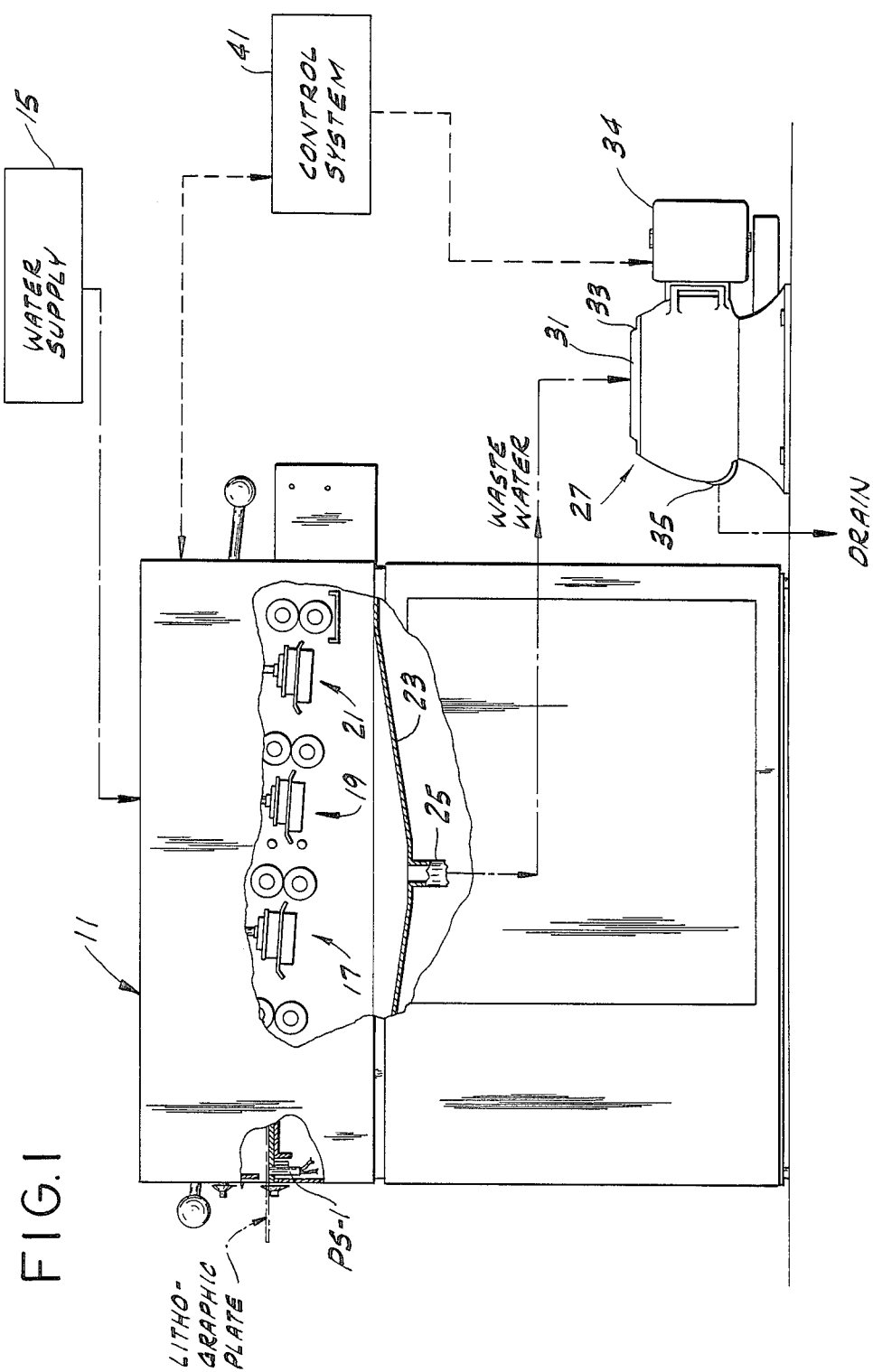
FIG. 1 is an overview of the waste water cleaning system used with a processing apparatus for exposed lithographic plates.

In FIG. 1 is shown a processing apparatus or lithoplater 11 for processing exposed lithographic plates. Detailed operation of an example of apparatus for processing exposed lithographic plates is found in U.S. Pat. No. 4,222,656 which disclosure is incorporated herein by reference. Lithoplater 11 has a water supply 15 connected thereto which is used for washing a lithographic plate during processing in the lithoplater 11 to remove residues which include solid contaminants. The wash water cleans or removes the residues and contaminants from the exposed lithographic plate. The plate passes through areas 17, 19 and 21 of the processing apparatus and after passing over the lithographic plate, the wash water is contaminated with the residues and solid contaminants and is then collected in the waste water drain pan 23.

The waste water exits pan 23 through opening 25 and is carried, for example, by a one and one-half inch flexible hose or pipe to a centrifuge 27. Centrifuge 27 is, for example, a commercially available unit from BARRETT CENTRIFUGALS, INC., Worcester, Mass.—MODEL NO. 125. The contaminated waste water is gravity fed into an inlet 31 in a cover 33 atop centrifuge 27. The one and one-half inch flexible hose is thus an example of means for carrying the waste water from the processing apparatus 11 to the inlet 31. The waste water enters a rotating bowl (not shown) in which it is subjected to forces of approximately 1000 G's (gravities) to cause the heavy particles, including the contaminants to be taken out of suspension and accumulate in the bowl. The bowl is rotated on sealed bearings (not shown) by a motor 34 included with centrifuge 27. Cleaned water flows over a rim at the top of the bowl and exits centrifuge 27 at an outlet 35. The cleaned water may then be carried, for example, by a three and one-half inch ID steel reinforced flexible neoprene outlet hose to a drain which should not easily clog since the heavy particles have been removed.

A control system 41 is for controlling the operation of the processing apparatus 11 and the centrifuge 27. Control system 41 operates such devices as the roller motor, control valves, heaters etc. As will be easily appreciated control system 41 may be easily included in the processing apparatus 11. The control system 41 is an example of control means for controlling the operation of the processing apparatus 11 and the centrifuge 27.

Figure 2:
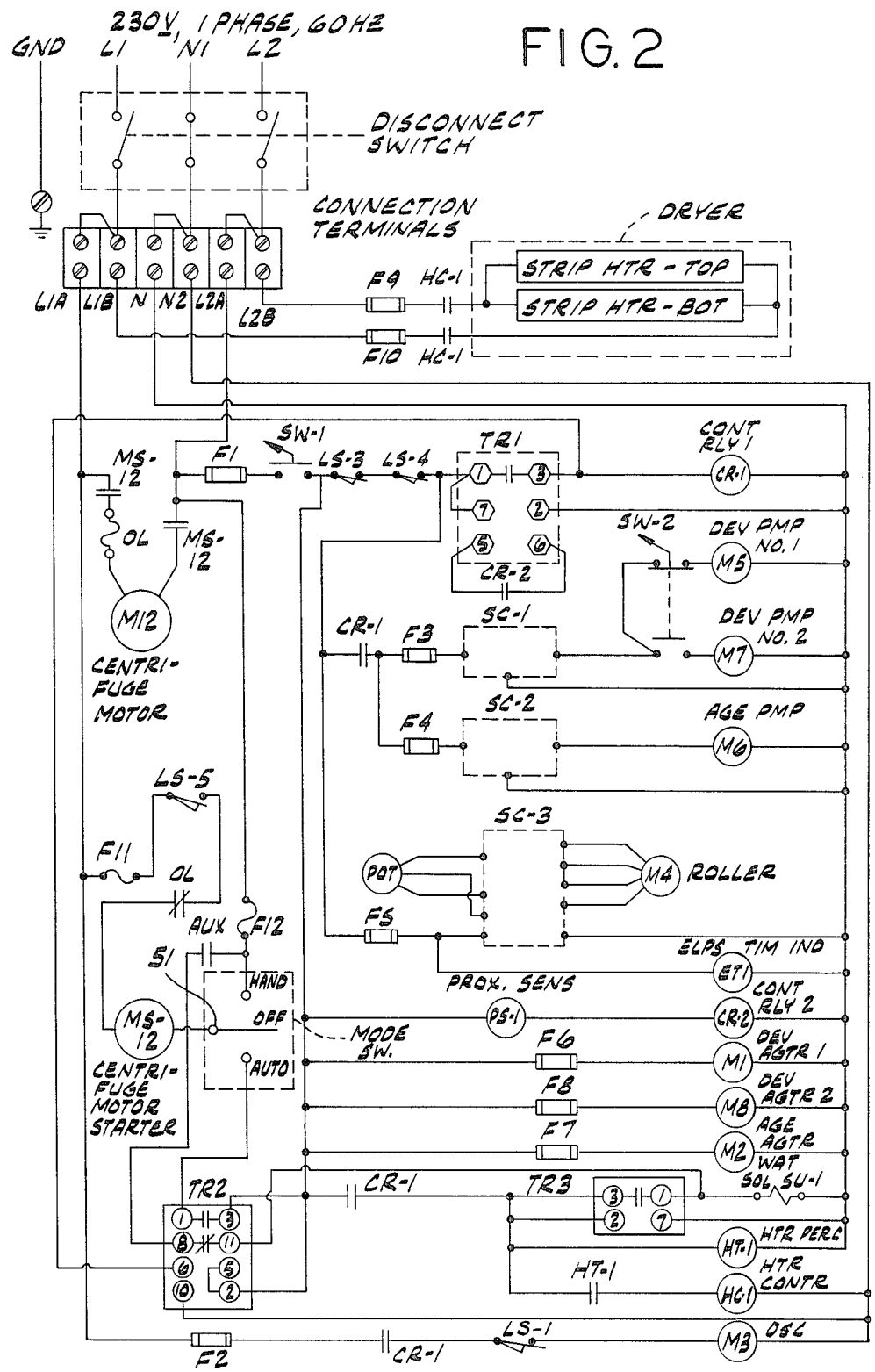
FIG. 2 is a schematic which includes the processing apparatus, a centrifuge and a control system.

FIG. 2 shows the detailed circuitry of the apparatus 11, centrifuge 27 and control system 41. Energy is supplied from a 230 volt, single phase line (L1, N, L2) through a Disconnect Switch to corresponding Connection Terminals which are connected to lines L1A & L1B, N1 & N2, L2A & L2B. Lines L1A and L2A supply power to the centrifuge motor M12 through relay contacts MS-12 in each of these lines. Overload protection for the motor M12 is provided by the overload sensor OL.

Line L2A also supplies power to other circuitry through fuse F1. A master power switch SW-1 supplies power through a switched terminal. The switched terminal of SW-1 is connected to a proximity sensor switch PS-1 which is positioned at an inlet platform on which exposed lithographic plates are placed for processing in apparatus 11. PS-1 is actuated upon insertion of an exposed lithographic plate in the processing apparatus 11 and deactuated when exposed lithographic plate has passed the proximity switch PS-1. When PS-1 is actuated, the coil of control relay CR-2, to which PS-1 is connected, is also energized.

Also connected to the switched terminal of SW-1 are developer agitator or mixer motor M1 (through fuse F6), developer agitator or mixer motor M8 (through fuse F8) and AGE or plate finisher (i.e., preservative or finish asphaltum gum extract) agitator or mixer motor M2 (through fuse F7). For brevity the use of these motors will not be described here but is discussed in the incorporated U.S. Pat. No. 4,222,656.

The switched terminal of SW-1 is additionally connected to terminals 2 and 3 of a time delay relay TR2. Relay TR2 is a delay off type or delay on break type (i.e., a time period will occur after terminal 6 is deenergized (initiate) during which the contacts will remain in the energized position and at the end of the time period the contacts will go their normal or deenergized position). Relay TR2 is a commercial type relay number TDBL120ALD available from SSAC, Inc. of Liverpool, N.Y. The time period is adjustable and may be for example approximately seven seconds.

Additionally the switched terminal of SW-1 is connected to a contact of control relay CR-1. This contact switchably connects power to terminals 2 and 3 of another delay relay TR3. Relay TR3 is a delay on type or delay on make type (i.e., a time period will occur after terminal 2 is energized (initiate) during which the contacts will remain in the deenergized or normal position and at the end of the time period the contacts will go to their energized position). Relay TR3 is a commercial type relay number TDM120AL available from SSAC, Inc. of Liverpool, N.Y. This time period is adjustable and may be set for example to approximately three seconds. Terminal 1 of relay TR3 is connected to water solenoid SV-1 which controls a valve for turning on and turning off the wash water from water supply 15. This terminal 1 is also electrically connected to terminal 11 of relay TR2.

The contact of relay CR-1 which connects power to terminals 2 and 3 of relay TR3 is also connected to a control coil of relay HT-1. Relay HT-1 has an adjustable control which is set at a percentage of time for which operation is desired (i.e., the setting percent is the percent time for which it is desired to have a contact of HT-1 on). The contact of relay HT-1 is connected to the contact of relay CR-1 and to a coil of a heater contactor relay HC-1. A dryer included in the processing apparatus heats the exposed and processed lithographic plate for drying as it exits the processing apparatus 11. Power to the dryer is provided from lines L1B and L2B through fuses F9 and F10. The dryer has a top and bottom strip heater switched on and off by contacts on relay HC-1. Depending on the setting on the adjustable control of relay HT-1, the strip heaters will be switched on and off. For example, at a 50% setting the strip heaters are on for 30 seconds and off for 30 seconds.

The switched terminal of master switch SW-1 is also connected to series connected front and rear cover safety limit switches LS-3 and LS-4 on the processing apparatus 11. These limit switches are also connected to terminals 1 and 7 of a delay relay TR1. Relay TR1 is a delay off type or delay on break type (i.e., a time period will occur after terminal 6 is disconnected from terminal 5 during which the contacts will remain in the energized position and at the end of the time period the contacts will go their normal or deenergized position). Relay TR1 is a commercial type relay number TRB120A2X240 available from SSAC, Inc. of Liverpool, N.Y. The time period is adjustable and may be for example approximately ninety seconds.

Terminals 5 and 6 of delay relay TR1 are connected and disconnected by a contact of control relay CR-2. Terminal 3 of relay TR1 (a normally open contact is between terminals 1 and 3) is connected to a coil of control relay CR1 and is also electrically connected to terminal 6 of delay relay TR2.

Series connected switches LS-3 and LS-4 are also connected to one terminal of another contact of relay CR-1. The other terminal of this contact of CR-1 is connected through fuses F3 and F4 respectively to speed controllers SC-1 and SC-2. Control SC-1 is used to vary the energy supplied to developer pump motor No. 1 (M5) and developer pump motor No. 2 (M7). Switch SW-2 switchably connects and disconnects the energy supplied from controller SC-1 to both motors M5 and M7. Controller SC-2 varies the energy supplied to AGE pump motor M6. As described in more detail in U.S. Pat. No. 4,222,656, the pump motors M5, M7 and M6 feed developer and AGE to the surface of the exposed lithographic plate being processed in the apparatus 11.

Additionally, series connected switches LS-3 and LS-4 are connected to another speed controller SC-3 (through fuse F5) and an elapsed time indicator ET1. The indicator ET1 measures run time of the apparatus 11 for scheduling maintenance. An adjustable potentiometer POT is used to vary the speed of roller motor M4 which is connected to controller SC-3. Roller motor M4 is for driving plate feed rolls as described in more detai in U.S. Pat. No. 4,222,656. Briefly, these rolls feed an exposed lithographic plate through areas 17, 19 and 21 in the processing apparatus 11.

A three position mode switch switchably connects a common terminal 51 to a HAND terminal (HAND position or mode, also referred to as "manual"), to an AUTO terminal (AUTO position or mode) or to no other terminal (OFF position or mode). The HAND terminal is connected through fuse F12 to line L2A. The HAND terminal is also connected through a normally open auxiliary contact AUX of a motor starter coil MS-12 on the centrifuge 27 to terminal 8 of delay relay TR2. The auxiliary contact AUX closes when the coil MS-12 is energized. The AUTO terminal of the mode switch is connected to terminal 1 of the delay relay TR2. Common terminal 51 of the mode switch is connected to a series connection of the centrifuge motor starter coil MS-12, a normally closed overload contact OL, centrifuge cover switch LS-5 and fuse F11. This series connection is in turn connected to line L1A.

Line L1A is also connected through fuse F2 to a third contact on control relay CR-1. This third contact on relay CR-1 is series connected to head safety limit switch LS-1 and oscillator motor M3. The motor M3 drives oscillating brush heads for distributing developer and plate finisher over the exposed lithographic plate in the processing apparatus 11.

The operation of the control system 41, centrifuge 27 and processing apparatus 11 will now be described with particular reference to FIGS. 3A and 3B. The timing diagram of FIG. 3A shows the operation when the mode switch is in the AUTO position. The mode switch is first placed in the AUTO position thereby electrically connecting terminal 1 of delay relay TR2 to centrifuge motor starter coil MS-12. Since relay TR2 has not been energized (i.e. terminal 6 does not have power supplied to it) the centrifuge motor M12 will not turn on.

The master switch SW-1 is then placed in the on position by the operator. Power is immediately supplied to turn on the developer agitator motor M1, developer agitator motor M8 and AGE agitator motor M2. Also, terminals 2 and 3 of delay relay TR2 are energized. Further, proximity switch PS-1 is activated (i.e. recieves power so that if energized the switch will close). If safety switches LS-3 and LS-4 are in a closed position, power is supplied to the roller motor M4 and the elapsed time indicator ET1. Power is also supplied to terminals 1 and 7 of delay relay TR1.

When an exposed lithographic plate is inserted into the processing apparatus, the proximity sensor switch PS-1 is closed (energized) and thus energizes control relay coil CR-2. The contact of control relay CR-2 which is connected between terminals 5 and 6 of delay relay TR1 will close and the contact of relay TR1 (between terminals 1 and 3 ) will close. Power is then supplied from terminal 3 of relay TR1 to the coil of control relay CR-1 and to terminal 6 of delay relay TR2.

When power is supplied to terminal 6 of relay TR2, the contact between terminals 1 and 3 of relay TR2 will close and power will be supplied to the centrifuge motor starter coil MS-12. The contacts associated with coil MS-12 will close and the centrifuge motor M12 will turn on. The proximity sensor switch is thus an example of means for starting the centrifuge 27.

The three contacts of control relay CR-1 will also close. Power will be supplied through one of the contacts of CR1 to developer pumps No. 1 (M5) and No. 2 (M7) and AGE pump (M6). Additionaly through another contact of CR1 power will be supplied to the oscillator motor M3. Also, the third contact of CR1 will connect the switched terminal of master switch SW1 to terminals 2 and 3 of delay relay TR3, to heater percentage timer HT-1 and to a contact on the timer HT-1. Contact HT-1 closes and heater contactor coil HC-1 is energized. The contacts of contactor HC-1 thus connect the top and bottom strip heaters of the dryer.

Connection of power to terminal 2 and 3 of delay relay TR3 will start the "turn on" time period of this relay. This is an adjustable predetermined time period and as noted above may be set to approximately 3 seconds. Thus after approximately 3 seconds the water solenoid SV-1 will be energized and wash water will begin flowing from the water supply 15 into the processing apparatus 11. The delay relay TR3 is an example of means for starting the flow of wash water into the processing apparatus 11 a first predetermined time after the start of the centrifuge 27. The wash water removes the contaminants from the exposed lithographic plate and cleans plate feed rolls as the plate passes through areas 17, 19 and 21 of the processing apparatus and is then collected in the waste water drain pan 23. This waste water exits pan 23 through opening 25 and is carried (gravity feed) to the centrifuge 27. The waste water enters the rotating bowl (not shown) in which the heavy particles are taken out of suspension and accumulate in the bowl. By delaying the opening of the water solenoid SV-1 approximately the three seconds, the centrifuge is advantageously up to full speed in order to assure complete processing of the initial waste water.

The lithographic plate will continue through the processing apparatus and eventually a trailing edge of the plate will go past the proximity sensor switch PS-1 (deactuation) and the contact of control relay CR-2 will open. The opening of the CR-2 contact will start the delay-off time period of the delay relay TR1. Relay TR1 has an adjustable, predetermined time delay which may be set to approximately one and one-half minutes (ninety seconds). The time period set on the relay TR1 is dependent on the speed of the roller motor M4 (i.e., the time delay is to permit complete processing of the lithographic plate in the apparatus 11).

At the end of the predetermined time delay of relay TR1, the contacts of control relay CR-1 will open and power will no longer be supplied to to developer pumps No. 1 (M5) and No. 2 (M7), AGE pump (M6), oscillator motor M3, heater percentage timer HT-1 and the top and bottom strip heaters of the dryer. Additionally, the water solenoid SV-1 will be turned off (stop the wash water supply) when the CR-1 contact opens. The control relay CR-1 is thus an example of means for stopping the flow of wash water into processing apparatus 11. And the time delay relay TR1 is an example of timing means for delaying the stop of the flow of wash water a third predetermined time period after deactuation of the proximity switch PS-1.

Also at the end of the predetermined time delay of relay TR1, the power is removed from terminal 6 of relay TR2. This will start the delay-off time period of the delay relay TR2. Relay TR2 has an adjustable, predetermined time delay which may be set to approximately seven seconds. The contact between terminals 1 and 3 of relay TR2 will open at the end of the predetermined time period and power will no longer be be supplied to the centrifuge motor starter coil MS-12. The contacts associated with coil MS-12 will open and the centrifuge motor M12 will turn off. The delay relay TR2 is an example of means for stopping the centrifuge 27 a second predetermined time after stopping the flow of wash water into the processing apparatus 11. Delaying the turn off of the centrifuge advantageously assures the complete processing of the residual waste water draining into the drain pan 23.

Thus, an efficient compact centrifuge 27 is employed for the solid/liquid separation to overcome the difficulty of separating the solid contaminants from the waste water and to eliminate the need of frequent filter changes or large awkward filter systems. For efficiently cleaning the waste water, certain delay times must be observed. These delay times are necessary so that waste water will not reach the centrifuge 27 before it reaches normal operating speed and so that the waste water stops prior to the centrifuge 27 going off and thus solids contained in the centrifuge bowl are not swept or flushed to the drain.

When the mode switch is in the OFF position, the centrifuge motor 37 will not operate. However, the processing apparatus 11 can be operated without the use of the centrifuge as described above with reference to the AUTO mode. In other words, the processing apparatus may be advantageously used when it is not desired to remove contaminants with the centrifuge (e.g., the centrifuge is being repaired). In the OFF mode the centrifuge bowl will overflow and the waste water will pass directly to the drain without contaminant removal.

Also the OFF position is used during cleaning or servicing the centrifuge. Cleaning of the bowl in the centrifuge is necessary to prevent buildup of contaminants (sludge). When the centrifuge is shut down solids should not be permitted to dry out and harden in the bowl.

The timing diagram of FIG. 3B shows the manual operation when the mode switch is in the HAND position. The mode switch is first placed in the HAND position thereby electrically connecting line L2A to to centrifuge motor starter coil MS-12. The centrifuge motor M12 is thus immediately started. The AUX contact will close when the motor starter coil MS-12 is energized and thus line L2A will supply power to terminal 8 of delay relay TR2. Since TR2 is in its normal state, the contact between terminals 8 and 11 is closed and power will be supplied to the water solenoid SV-1. The wash water from supply 15 will thus start flowing into the processing apparatus 11 at approximately the same time that the centrifuge starts.

The master switch SW-1 is placed in the on position by the operator and the identical functions described with respect to the AUTO mode are performed.

When an exposed lithographic plate is inserted into the processing apparatus and the mode switch is in the HAND position, the operation described above with reference to the AUTO position is very similar. The proximity sensor switch PS-1 will close and control relay coil CR-2 will energize. The contact of control relay CR-2 which is connected between terminals 5 and 6 of delay relay TR1 will close and the contact of relay TR1 (between terminals 1 and 3 ) will close. The coil of control relay CR-1 and terminal 6 of delay relay TR1 are supplied power from terminal 3 of relay TR1.

When power is supplied to terminal 6 of relay TR2, the contact between terminals 1 and 3 of relay TR2 will close and the contact between terminals 8 and 11 of relay TR2 will open. The water solenoid SV-1 is thus no longer supplied power from terminal 11 of delay relay TR2.

In a manner similar to the AUTO mode the contacts of control relay CR-1 will also close and power will be supplied to developer pumps No. 1 (M5) and No. 2 (M7) and AGE pump (M6). Additionaly through another contact of CR1 power will be supplied to the oscillator motor M3. Also, the third contact of CR1 will connect the switched terminal of master switch SW1 to terminals 2 and 3 of delay relay TR3, to heater percentage timer HT-1 and to a contact on the timer HT-1. Contact HT-1 closes and heater contactor coil HC-1 is energized and the contacts of contactor HC-1 thus connect the top and bottom strip heaters of the dryer.

Connection of power to terminal 2 and 3 of delay relay TR3 will start the "turn on" time period of this relay. Since the wash water was interrupted (water solenoid SV-1 is off) the wash water will be off until approximately 3 seconds after the insertion of the exposed lithographic plate.

The lithographic plate will continue through the processing apparatus and eventually a trailing edge of the plate will go past the proximity sensor switch PS-1 and the contact of control relay CR-2 will open. The opening of the CR-2 contact will start the delay-off predetermined time period of the delay relay TR1.

At the end of the predetermined time delay of relay TR1, the contacts of control relay CR-1 will open and power will no longer be supplied to to developer pumps No. 1 (M5) and No. 2 (M7), AGE pump (M6), oscillator motor M3, heater percentage timer HT-1 and the top and bottom strip heaters of the dryer. Also at the end of the predetermined time delay of relay TR1, the power is removed from terminal 6 of relay TR2. This will start the delay-off time period of the delay relay TR2. Thus, during this TR2 delay (seven seconds) the water solenoid SV-1 is closed and the wash water is stopped. The contact between terminals 1 and 3 of relay TR2 will open at the end of the predetermined time period and the contact between terminals 8 and 11 of relay TR2 will close to supply power to water solenoid SV-1 and turn on the wash water.

Unlike the operation in the AUTO mode, the water solenoid SV-1 and centrifuge are continuously on (except for the short three second and seven second periods described above) and wastewater is thus supplied to the continuously operating centrifuge for cleaning. By operating in the HAND mode the time delay cycling as in the AUTO mode is not used and the continuous operation will advantageously prolong life of any centrifuge bearings.

The lithoplater is turned off by first turning off the master switch SW-1 as shown in FIG. 3B. The mode switch is then returned to the OFF position at which time both the water solenoid SV-1 and centrifuge 27 will be turned off. Thus by moving the mode switch out of the manual or HAND position both the wash water and centrifuge are stopped.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. In combination, a waste water cleaning system and an apparatus for processing exposed lithographic plates, the processing apparatus receiving through an inlet means wash water for use in the processing, the cleaning system comprising:

a centrifuge for removing contaminants from waste water from the processing apparatus, said centrifuge having an inlet means for receiving waste water from the processing apparatus and an outlet means for discharging the cleaned water;

means for carrying the waste water from the processing apparatus to the centrifuge inlet means; and control means for controlling the operation of the processing apparatus and the centrifuge including:

means for starting the centrifuge;

means associated with the processing apparatus for starting the flow of wash water into said inlet means of the processing apparatus a first predetermined time after the start of the centrifuge, said means for starting the flow of wash water being responsive to the means for starting the centrifuge;

means associated with the processing apparatus for stopping the flow of wash water into said inlet means of the processing apparatus; and means associated with the processing apparatus for stopping the centrifuge a second predetermined time after stopping the flow of wash water into said inlet means of the processing apparatus, said means for stopping the centrifuge being responsive to said means for stopping the flow of wash water.

2. The combination as set forth in claim 1 wherein the means for starting the flow of wash water into the processing apparatus includes a variable delay relay for adjusting the first predetermined time period.

3. The combination as set forth in claim 1 wherein the means for stopping the centrifuge includes a variable delay relay for adjusting the second predetermined time period.

4. The combination as set forth in claim 1 wherein the control means includes a switch means associated with the processing apparatus for actuating said control means upon insertion of an exposed lithographic plate in the processing apparatus to start the first predetermined time period and for deactuating said control means when the exposed lithographic plate has passed said switch means to initiate the start of the second predetermined time period.

5. The combination as set forth in claim 4 further comprising timing means for delaying the stop of the flow of wash water a third predetermined time period after deactuation of the switch.

6. The combination as set forth in claim 1 wherein the control means further comprises a mode switch for selectively switching to and out of a manual mode and means operable in the manual mode for starting the centrifuge and the flow of wash water in response to the mode switch being switched to the manual mode.

7. In combination, a waste water cleaning system and an apparatus for processing exposed lithographic plates, the processing apparatus including an inlet means for receiving wash water for use in the processing, the cleaning system comprising:

a cetrifuge for removing contaminants from waste water from the processing apparatus, said centrifuge having an inlet means for receiving waste water from the processing apparatus and an outlet means for discharging the cleaned water;

means for carrying the waste water from the processing apparatus to the centrifuge inlet means; and control means for controlling the operation of the processing apparatus and the centrifuge including:

a proximity switch for starting the centrifuge and which is actuated upon insertion of an exposed lithographic plate in the processing apparatus and deactuated when the exposed lithographic plate has passed the proximity switch;

a delay relay for starting the flow of wash water into said inlet means of the processing apparatus a first predetermined time after actuation of the proximity switch;

timing means responsive to deactuation of the proximity switch for stopping the flow of wash water a second predetermined time period after deactuation of the proximity switch; and a delay relay for stopping the centrifuge a third predetermined time after deactuation of the proximity switch.

8. A method of cleaning waste water for use with apparatus for processing exposed lithographic plates, the processing apparatus receiving wash water for use in the processing, the method comprising the steps of:

carrying the waste water from the processing apparatus to an inlet means of a centrifuge for removing contaminants from waste water from the processing apparatus, the centrifuge also having an outlet means for discharging the cleaned water; and controlling the operation of the processing apparatus and the centrifuge by the steps of:

starting the centrifuge;

starting the flow of wash water into an inlet means of the processing apparatus a first predetermined time after the start of the centrifuge;

stopping the flow of wash water into processing apparatus; and stopping the centrifuge a second predetermined time after stopping the flow of wash water into said inlet means of the processing apparatus.

9. A waste water cleaning method as set forth in claim 8 further comprising the step of adjusting the first predetermined time period.

10. A waste water cleaning method as set forth in claim 8 further comprising the step of adjusting the second predetermined time period.

11. A waste water cleaning method as set forth in claim 8 wherein the processing apparatus includes a proximity switch actuated upon insertion of an exposed lithographic plate in the processing apparatus and the method includes the step of actuating the proximity switch by inserting the exposed lithographic plate to start the first predetermined time period.

12. A waste water cleaning method as set forth in claim 11 wherein the proximity switch is deactuated when the exposed lithographic plate has passed the proximity switch and the method includes deactuating the proximity switch to start the second predetermined time period.

13. A waste water cleaning method as set forth in claim 8 wherein the processing apparatus includes a proximity switch actuated upon insertion of an exposed lithographic plate in the processing apparatus and deactuated when the exposed lithographic plate has passed the proximity switch and the method includes the step of delaying the stop of the flow of wash water a third predetermined time period after deactuation of the proximity switch.

14. A waste water cleaning method as set forth in claim 8 wherein the processing apparatus includes a mode switch for selectively switching to and out of a manual mode and the method includes the step of starting the centrifuge and the flow of wash water into said inlet means of the processing apparatus in response to the mode switch being switched to the manual mode.

15. A waste water cleaning method as set forth in claim 14 which further includes the step of stopping the centrifuge and the flow of wash water in response to the mode switch being switched out of the manual mode.

* * * * *